(12) United States Patent
Matsuda

(10) Patent No.: US 7,038,273 B2
(45) Date of Patent: May 2, 2006

(54) SEMICONDUCTOR DEVICE

(75) Inventor: Tadashi Matsuda, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 10/807,247

(22) Filed: Mar. 24, 2004

(65) Prior Publication Data

US 2005/0156201 A1 Jul. 21, 2005

(30) Foreign Application Priority Data

Jan. 21, 2004 (JP) .............................. 2004-013459

(51) Int. Cl.
*H01L 29/76* (2006.01)
(52) U.S. Cl. ...................... 257/331; 257/341
(58) Field of Classification Search .............. 257/331, 257/341, 342, 378
See application file for complete search history.

(56) References Cited

U.S. PATENT DOCUMENTS 6,072,214 A * 6/2000 Herzer et al. ............... 257/331

2005/0156201 A1* 7/2005 Matsuda ..................... 257/213

OTHER PUBLICATIONS

Mitsuhiko Kitagawa, et al., "A 4500 V Injection Enhanced Insulated Gate Bipolar Transistor (IEGT) Operating in a Mode Similar to a Thyristor", IDEM Tech Dig., 1993, pp. 679-682, Dec. 1993.

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A semiconductor device includes a trench gate IGBT and a MISFET. The IGBT has an auxiliary base layer which is formed in an arbitrary region between two adjacent trenches and is insulated from an emitter electrode of the IGBT, and a carrier discharge electrode which contacts a surface of the auxiliary base layer. The MISFET is connected to the emitter electrode and the carrier discharge electrode and turned on upon turning off the IGBT. Upon turning off the IGBT, the accumulated carriers below the auxiliary base layer are discharged to the emitter electrode via the auxiliary base layer, the carrier discharge electrode, and the MISFET. This promotes the carrier discharge effect in turn-off, realizing a high-speed turn-off characteristic.

13 Claims, 8 Drawing Sheets

US 7,038,273 B2

SEMICONDUCTOR DEVICE

CROSS REFERENCE TO RELATED APPLICATION

This application is based upon and claims benefit of priority under 35 USC 119 from the Japanese Patent Application No. 2004-13459, filed on Jan. 21, 2004, the entire contents of which are incorporated herein by reference.

BACKGROUND OF THE INVENTION

The present invention relates to a semiconductor device including a trench gate type insulated gate bipolar transistor (to be simply referred to as an IGBT hereinafter).

In recent years, a low loss in power semiconductor elements is commercially required more and more. To obtain a lower ON voltage, trench gate IGBTs are put into practical use.

The trench gate IGBT can attain a low ON voltage characteristic because the channel resistance is low due to smaller cell size than in a traditional planar gate IGBT, the structure does not have any parasitic JFET (Junction Field Effect Transistor), unlike the planar gate IGBT, and no voltage drop by the pinch-off effect occurs.

FIG. 10 shows the basic sectional structure of a conventional trench gate IGBT.

A lightly doped, high-resistance n-type semiconductor layer 12 is formed on a p$^+$-type semiconductor substrate 11. A p-type base layer 13 about 4 μm deep is formed in the surface portion of the n$^-$-type semiconductor layer 12. An n$^+$-type emitter layer 14 about 0.5 μm deep is formed in the surface portion of the p-type base layer 13 by impurity diffusion.

Trenches about 1 μm wide and about 6 to 7 μm deep are selectively formed by RIE (Reactive Ion Etching). A polysilicon layer or the like about 0.5 μm thick is formed on a gate insulating film 15 about 0.1 μm thick, and buried in each trench. The surface of the buried layer is planarized to form a gate electrode 16.

An emitter electrode 17 which ohmic-contacts both the p-type base layer 13 and n$^+$-type emitter layer 14 is formed. A collector electrode 18 is formed on the lower surface of the p$^+$-type semiconductor substrate 11.

A reference which discloses a technique for a conventional IGBT is as follows:

Japanese Patent Laid-Open No. 2001-168333

The conventional trench gate IGBT suffers the following problems.

The area of the p-type base layer 13 is large, and the discharge effect of holes injected from the p$^+$-type semiconductor substrate 11 to the n$^-$-type semiconductor layer 12 is high. An effect of injecting electrons from the emitter layer 14 so as to compensate for holes in accordance with the charge neutralization condition is weak. The conductivity modulation of the high-resistance n$^-$-type semiconductor layer 12 is not satisfactory, failing to reduce the ON voltage.

Also in turn-off which is an event of discharging carriers, the loss cannot be fully reduced.

SUMMARY OF THE INVENTION

According to one aspect of the present invention, there is provided a semiconductor device including a trench gate IGBT, comprising:

a first semiconductor layer of a first conductivity type;

a second semiconductor layer of a second conductivity type which is formed on one surface of said first semiconductor layer;

a base layer of the first conductivity type which is formed in a surface portion of the second semiconductor layer;

emitter layers of the second conductivity type which are selectively formed in a surface portion of said base layer;

a plurality of trenches which extend through said emitter layers and said base layer and are formed to a predetermined depth in the second semiconductor layer;

gate electrodes which are formed on gate insulating films in the trenches;

an emitter electrode which is formed on said emitter layers and said base layer;

a collector electrode which is formed on the other surface of said first semiconductor layer;

an auxiliary base layer of the first conductivity type which is formed in an arbitrary region between two adjacent trenches and is insulated from said emitter electrode; and a carrier discharge electrode which contacts a surface of said auxiliary base layer of the first conductivity type.

According to one aspect of the present invention, there is provided a semiconductor device including a trench gate IGBT, comprising:

a first semiconductor layer of a first conductivity type;

a second semiconductor layer of a second conductivity type which is formed on one surface of said first semiconductor layer;

a base layer of the first conductivity type which is formed in a surface portion of the second semiconductor layer;

emitter layers of the second conductivity type which are selectively formed in a surface portion of said base layer;

a plurality of trenches which extend through said emitter layers and said base layer and are formed to a predetermined depth in the second semiconductor layer;

gate electrodes which are formed on gate insulating films in the trenches;

an emitter electrode which is formed on said emitter layers and said base layer;

a collector electrode which is formed on the other surface of said first semiconductor layer;

a first auxiliary base layer of the first conductivity type which is formed in an arbitrary region between two adjacent trenches and is insulated from said emitter electrode;

a second auxiliary base layer of the second conductivity type which is formed on the first auxiliary base layer of the first conductivity type in the region;

a third auxiliary base layer of the first conductivity type which is formed on the second auxiliary base layer of the second conductivity type in the region and contacts said emitter electrode; and a carrier discharge electrode which contacts a surface of said third auxiliary base layer of the first conductivity type.

According to one aspect of the present invention, there is provided a semiconductor device including a trench gate IGBT, comprising:

a trench gate IGBT having a first semiconductor layer of a first conductivity type, a second semiconductor layer of a second conductivity type which is formed on one surface of the first semiconductor layer, a base layer of the first conductivity type which is formed in a surface portion of the second semiconductor layer, emitter layers of the second conductivity type which are selectively formed in a surface portion of the base layer, a plurality of trenches which extend through the emitter layers and the base layer and are formed to a predetermined depth in the second semiconductor layer, gate electrodes which are formed on gate insulating films in the trenches, an emitter electrode which is formed on the emitter layers and the base layer, a collector electrode which is formed on the other surface of the first semiconductor layer, an auxiliary base layer of the first conductivity type which is formed in an arbitrary region between two adjacent trenches, and a carrier discharge electrode which contacts a surface of the auxiliary base layer of the first conductivity type; and a MISFET which includes a channel region of the first conductivity type, and includes a source connected to the carrier discharge electrode of the trench gate IGBT, a drain connected to the emitter electrode of the trench gate IGBT, and a gate electrode electrically connected to the gate electrode of the trench gate IGBT.

DETAILED DESCRIPTION OF THE INVENTION

Embodiments of the present invention will be described below with reference to the accompanying drawings.

FIRST EMBODIMENT

Figure 1:
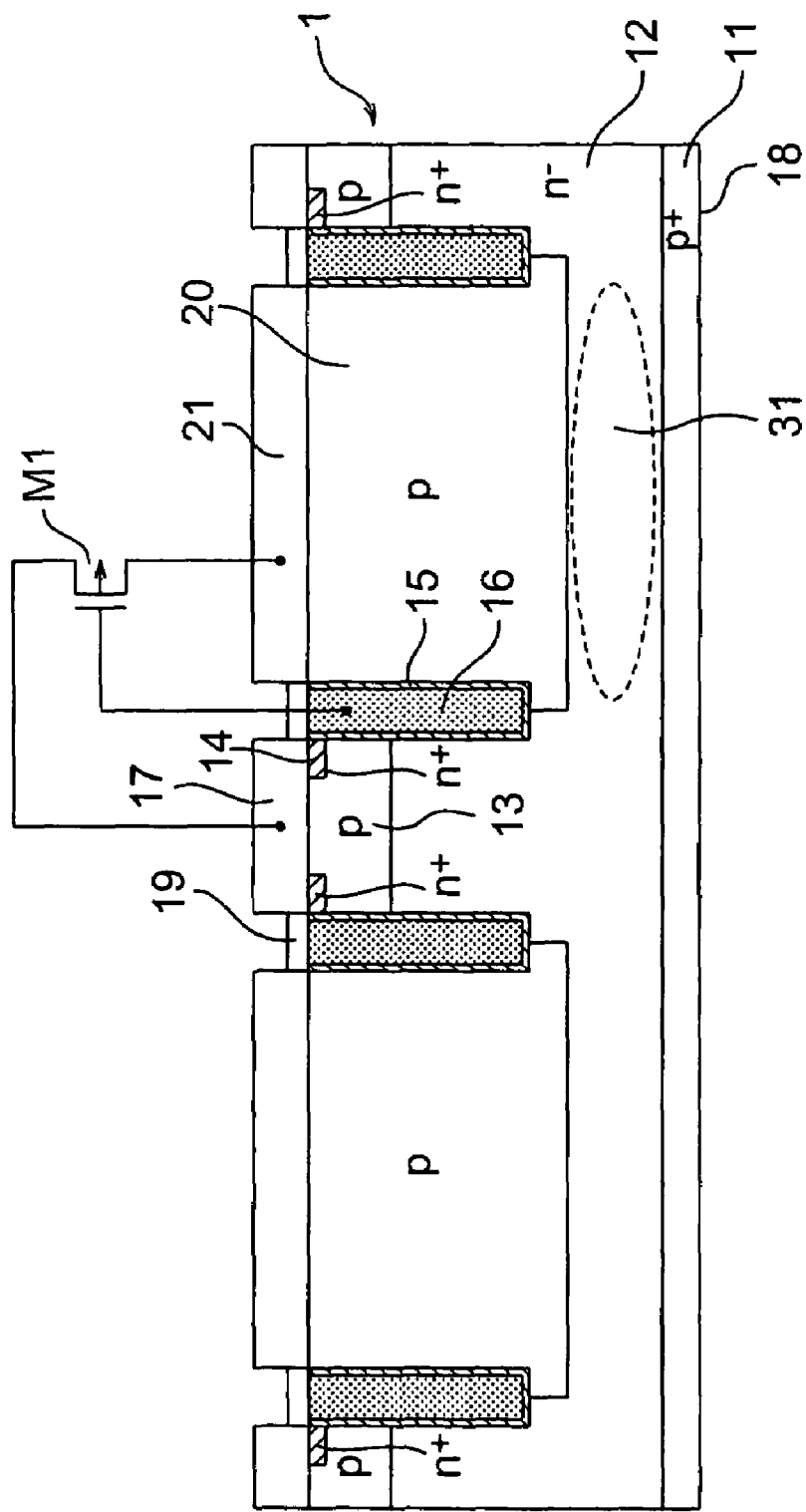
FIG. 1 is a longitudinal sectional view showing the structure of a trench gate IGBT and external carrier discharge MISFET included in a semiconductor device according to the first embodiment of the present invention.

A trench IGBT included in a semiconductor device according to the first embodiment of the present invention will be described with reference to FIG. 1 showing the sectional structure of a chip 1.

In order to realize a low ON voltage in a trench gate IGBT, the trench gate is desirably wide in consideration of the packing density efficiency of the cell. A wide trench gate decreases the area of a p-type base layer 13. This weakens the discharge effect of holes injected from a $p^+$-type semiconductor substrate 11 to a high-resistance $n^-$-type semiconductor layer 12. Injection of electrons from an emitter layer 14 is so promoted as to compensate for holes in accordance with the charge neutralization condition. The conductivity modulation of the high-resistance $n^-$-type semiconductor layer 12 can be more effectively done.

An auxiliary p-type base layer 20 at a floating potential is inserted between adjacent trench gates to substantially widen the trench gate and reduce the area of the p-type base layer 13. A small area of the p-type base layer 13 increases the carrier density to decrease the ON voltage.

In this structure, however, carriers 31 are accumulated upon turn-on below the auxiliary p-type base layer 20 which widens the trench gate. In turn-off which is an event of discharging carriers, the effect of discharging the carriers 31 is weak, increasing the loss.

To prevent this, a p-channel MISFET M1 which is turned on upon turning off the IGBT is formed. Further, a carrier discharge electrode 21 is so formed as to contact the surface of the auxiliary p-type base layer 20. The source of the p-channel MISFET M1 is connected to the carrier discharge electrode 21, the drain is connected to an emitter electrode 17, and the gate is connected to a gate electrode 16. Upon turning off the IGBT, the gate electrode 16 changes to low level, and the p-channel MISFET M1 is turned on. The accumulated carriers 31 are discharged to the emitter electrode 17 via the auxiliary base layer 20, carrier discharge electrode 21, and MISFET M1. This promotes the carrier discharge effect in turn-off, realizing a high-speed turn-off characteristic.

A semiconductor device manufacturing method according to the first embodiment will be explained.

A lightly doped $n^-$-type semiconductor layer 12 with a resistivity of 50 Ωcm or more is formed to about 100 μm by epitaxial growth on the surface of, e.g., a $p^+$-type semiconductor substrate 11 serving as the first semiconductor layer of the first conductivity type.

Trenches are formed to a depth of about 7 μm by RIE in the surface portion of the semiconductor layer 12.

The semiconductor substrate 11 is oxidized to form a gate insulating film 15 at a film thickness of about 0.1 μm on the surface in each trench. A polysilicon layer is formed at a film thickness of about 0.5 μm by CVD, thereby filling the trench. After that, the polysilicon layer is etched back by RIE to planarize the surface.

A resist film (not shown) having openings every other regions between adjacent trenches where an auxiliary p-type base layer 20 is to be formed is formed. An impurity such as boron is ion-implanted using the resist film as a mask, and diffused to about 8 μm to form the auxiliary p-type base layer 20. The resist film is then removed.

A resist film having openings every region between adjacent trenches where no auxiliary p-type base layer 20 is formed is formed. Boron is ion-implanted using the resist film as a mask, and diffused to about 4 μm to form a p-type base layer 13. The resist film is then removed.

By the same method, arsenic is selectively ion-implanted and diffused to about 0.5 μm to form $n^+$-type emitter layers 14 with an area of about 2 μm². The emitter layers 14 are formed in the surface portion of the base layer 13 between adjacent trenches at a predetermined distance from corresponding trenches except the central region.

Insulating films such as silicon oxide films are deposited by CVD to form interlayer dielectric films 19. Openings for contacting both the p-type base layer 13 and n+-type emitter layer 14 are formed in the interlayer dielectric films 19. An emitter electrode 17 and carrier discharge electrode 21 are formed.

A V—Ni—Au film or the like is deposited on the lower surface of the semiconductor substrate 11 to form a collector electrode 18.

As described above, the IGBT according to the first embodiment has the carrier discharge electrode 21 which contacts the auxiliary p-type base layer 20.

The source of the p-channel MISFET M1 is connected to the carrier discharge electrode 21, the drain is connected to the emitter electrode 17, and the gate electrodes are commonly connected. When the IGBT is ON, both the gate electrodes receive a high-level voltage, and the p-channel MISFET M1 is OFF. No carrier (hole) is discharged from the carrier discharge electrode 21, and the conductivity modulation of the high-resistance $n^-$-type semiconductor layer 12 is effectively done to realize a low ON voltage.

When the IGBT is turned off, both the gates receive a low-level voltage, and the p-channel MISFET M1 is turned on. The auxiliary p-type base layer 20 is short-circuited to the emitter electrode 17, and carriers are actively discharged to shorten the turn-off time.

Consequently, a low ON voltage characteristic and small turn-off loss can be achieved.

The IGBT and external p-channel MISFET M1 may be mounted 1) in the same package, or 2) in different packages.

1) Case in which IGBT and MISFET M1 are Mounted in Same Package 1-1) For Lateral MISFET M1

Figure 2:
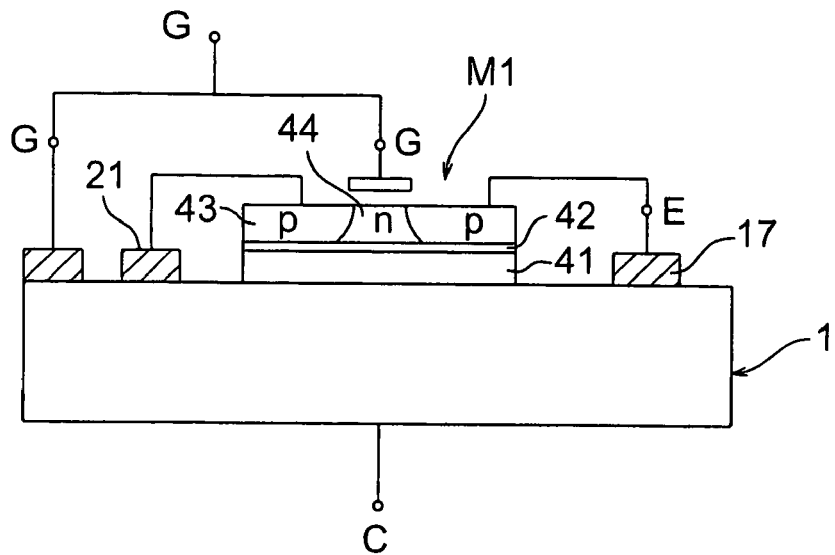
FIG. 2 is a longitudinal sectional view showing a structure when the trench gate IGBT and a lateral carrier discharge MISFET are mounted in the same package.

As shown in FIG. 2, a chip-on-chip structure is adopted in which the p-channel MISFET M1 is fixed to an arbitrary portion of the emitter electrode on the chip 1 of the IGBT. In the p-channel MISFET M1, p-type impurity diffusion layers 43 serving as source and drain regions and an n-type impurity diffusion layer 44 serving as a channel region are formed in an SOI substrate having a semiconductor substrate 41 and silicon oxide film 42. The lower surface of the MISFET M1 is fixed to the chip 1 of the IGBT while being insulated by the silicon oxide film 42.

The gate electrode of the p-channel MISFET M1 is connected to that of the IGBT, the source electrode of the MISFET M1 is connected to the carrier discharge electrode 21, and the drain electrode of the MISFET M1 is connected to the emitter electrode. In this state, the p-channel MISFET M1 and IGBT are sealed in the same package.

1-2) For Vertical MISFET M1

In this case, two chips are arranged side by side and connected, instead of fixing the MISFET M1 onto the chip 1 of the IGBT.

Figure 3:
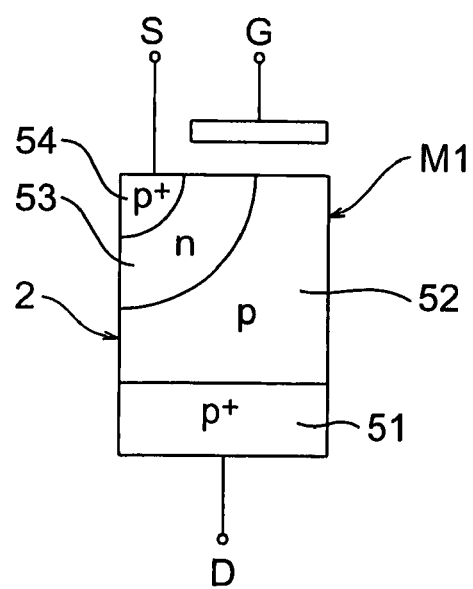
FIG. 3 is a longitudinal sectional view showing the structure of the carrier discharge MISFET when the trench gate IGBT and a vertical carrier discharge MISFET are mounted in the same package.

A vertical MISFET M1 has, for example, a structure shown in FIG. 3. An n-type impurity diffusion layer 53 is formed as a channel region in part of one surface of a p-type semiconductor substrate 52. A $p^+$-type impurity diffusion layer 54 is formed as a drain region in part of the n-type impurity diffusion layer 53. A $p^+$-type impurity diffusion layer 51 is formed as a source region entirely on the other surface of the p-type semiconductor substrate 52.

Figure 4:
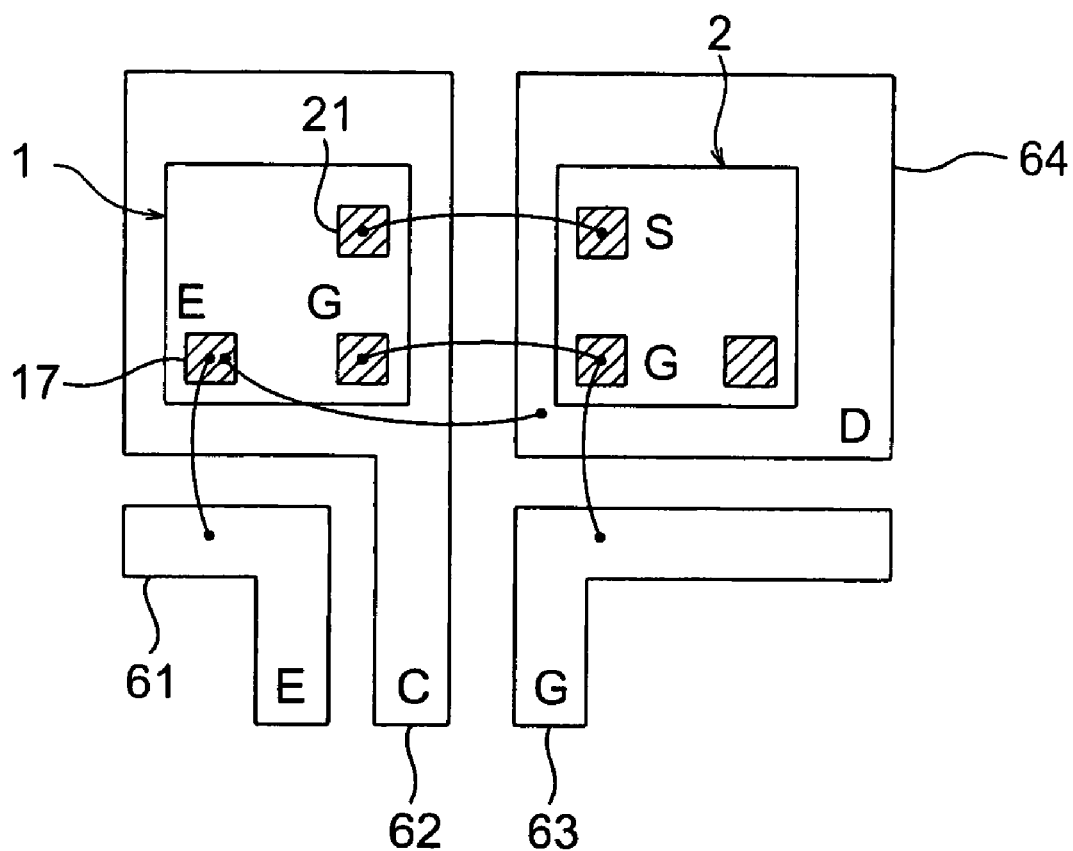
FIG. 4 is a plan view showing the connection of the carrier discharge MISFET and trench gate IGBT shown in FIG. 3.

As shown in FIG. 4, the chip 1 of the IGBT and a chip 2 of the MISFET M1 are mounted on lead frames 61 to 64, and connected by bonding wires.

More specifically, the chip 1 of the IGBT is mounted on the collector lead frame 62, whereas the chip 2 of the MISFET M1 is mounted on the drain lead frame 64.

The emitter electrode 17 of the chip 1 is connected to the emitter lead frame 61 and drain lead frame 64. The gate electrode of the chip 1 is connected to that of the chip 2, and the gate electrode of the chip 2 is connected to the gate lead frame 63. The carrier discharge electrode 21 of the chip 1 is connected to the source electrode of the chip 2. In this state, the chips 1 and 2 are sealed in the same package.

2) Case in which IGBT and MISFET M1 are Mounted in Different Packages

In this case, a structure is employed in which the chip of the IGBT and that of the external MISFET M1 are sealed in different packages. An IGBT electrode structure for connecting the MISFET M1 in another package will be explained.

Figure 5:
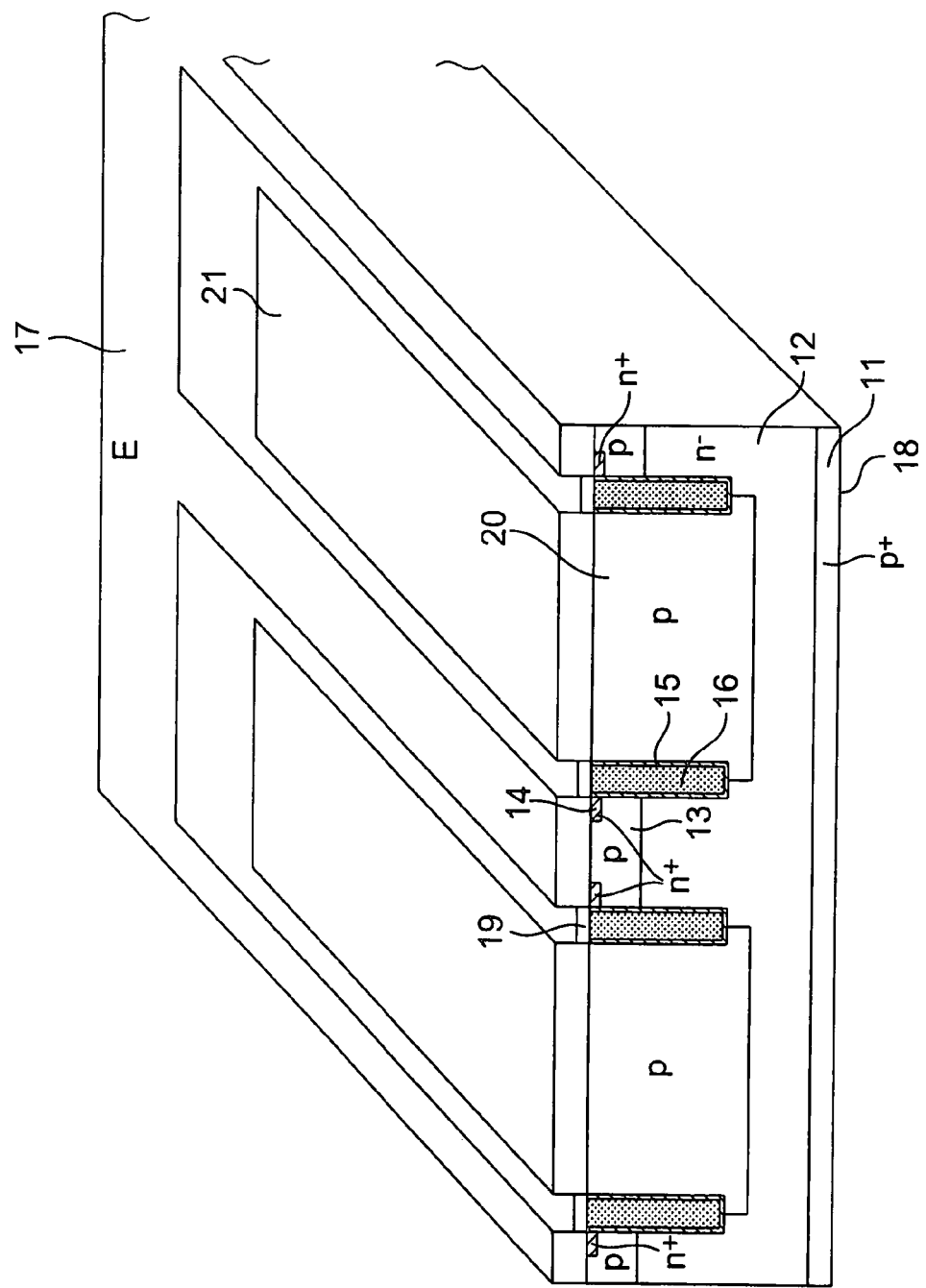
FIG. 5 is a perspective view showing the structure of the trench gate IGBT when the trench gate IGBT and carrier discharge MISFET are mounted in different packages.

The emitter electrode 17 and carrier discharge electrode 21 in the chip 1 of the IGBT shown in FIG. 1 have a planar structure shown in the perspective view of FIG. 5.

Figure 6:
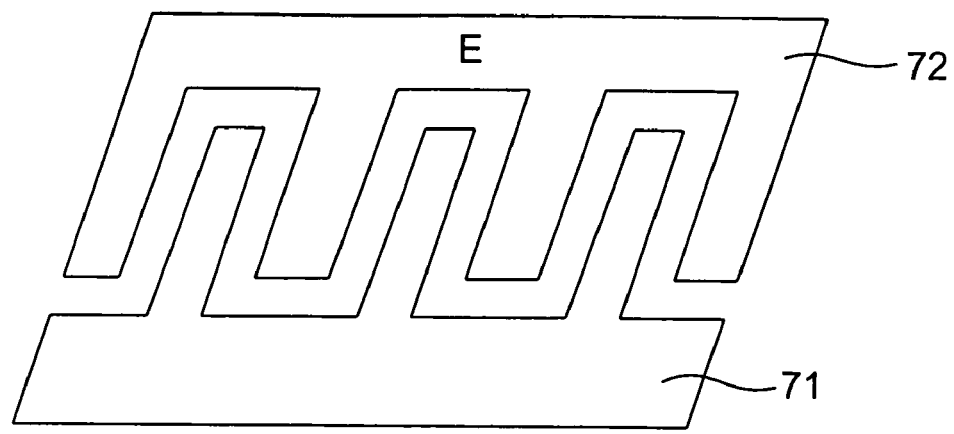
FIG. 6 is a perspective view showing the structure of comb electrodes in the trench gate IGBT shown in FIG. 5.

A carrier discharge comb electrode 71 shown in FIG. 6 and a facing emitter comb electrode 72 are arranged on the chip 1.

Figure 7:
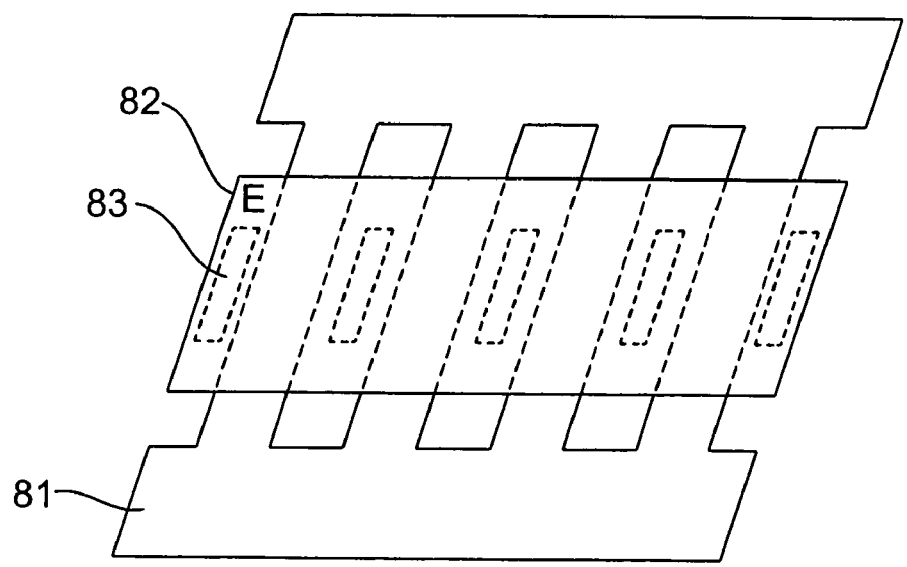
FIG. 7 is a perspective view showing a two-layered interconnection structure in the trench gate IGBT shown in FIG. 5.

Alternatively, as shown in FIG. 7, a carrier discharge interconnection layer 81 serving as the first layer is formed on the chip 1, and an emitter interconnection layer 82 serving as the second layer is formed on an interlayer dielectric film (not shown). The emitter interconnection layer 82 has a region 83 in contact with a contact for connecting the emitter electrode 17.

SECOND EMBODIMENT

Figure 8:
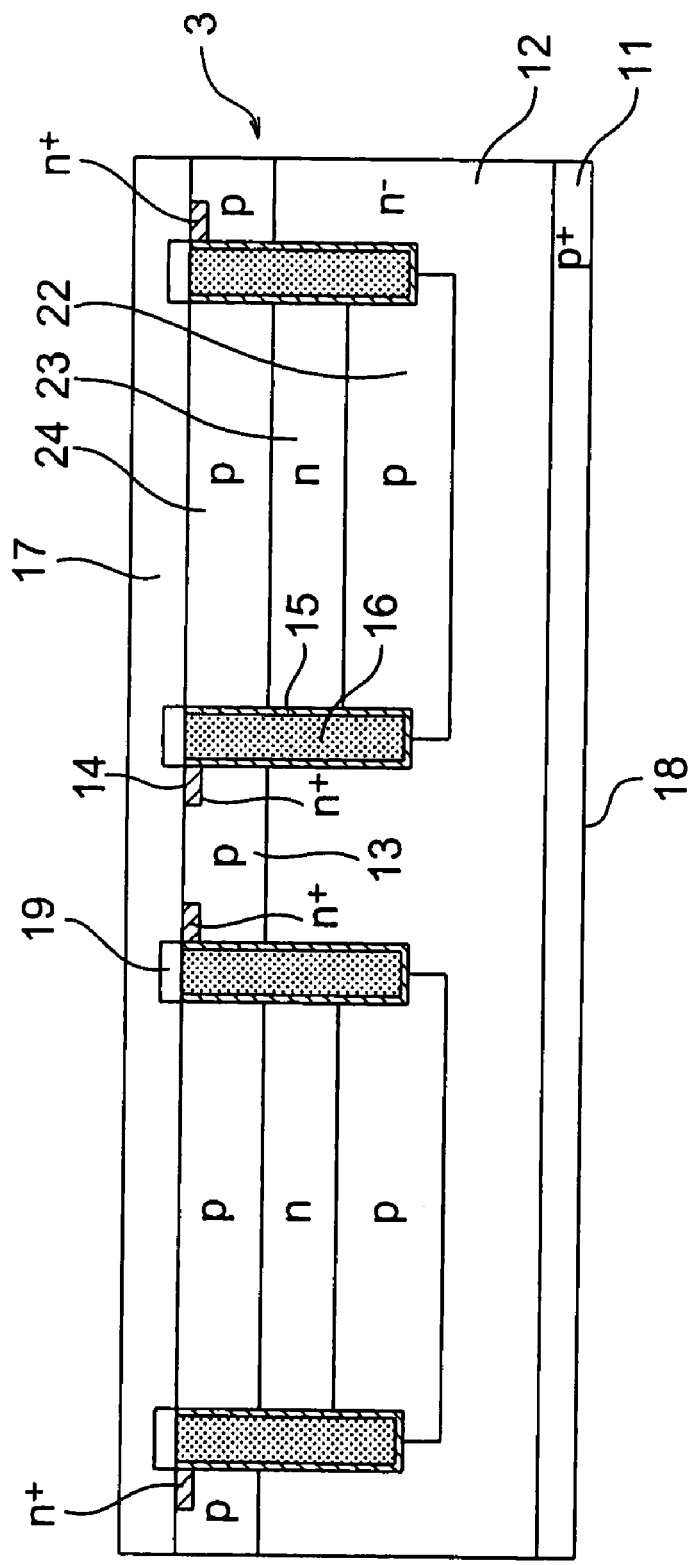
FIG. 8 is a longitudinal sectional view showing the sectional structure of a trench gate IGBT included in a semiconductor device according to the second embodiment of the present invention.

A trench IGBT included in a semiconductor device according to the second embodiment of the present invention will be described with reference to FIG. 8 showing the sectional structure of a chip 3.

An IGBT according to the second embodiment has a structure in which a carrier discharge p-channel MISFET is formed in the element. A semiconductor device manufacturing method according to the second embodiment will be described.

A lightly doped $n^-$-type semiconductor layer 12 with a resistivity of 50 Ωcm or more is formed to about 100 μm on a $p^+$-type semiconductor substrate 11 by epitaxial growth.

A mask (not shown) is formed, in order to form a first auxiliary p-type base layer 22 at a predetermined depth every other regions between adjacent trenches. Boron is selectively ion-implanted at a high acceleration voltage of several MeV, and diffused to form the first auxiliary p-type base layer 22.

Trenches are formed to a depth of about 7 μm by RIE. The semiconductor substrate 11 is oxidized by about 0.1 μm, forming a gate insulating film 15.

A polysilicon layer is formed by about 0.5 μm by CVD, filling each trench. The polysilicon layer is etched back by RIE to planarize its surface.

In order to form a second auxiliary n-type base layer 23 on the first auxiliary p-type base layer 22 between trenches, phosphorus is selectively ion-implanted and diffused to form the second auxiliary n-type base layer 23.

In order to form a third auxiliary p-type base layer 24 on the second auxiliary n-type base layer 23 between trenches, boron is selectively ion-implanted and diffused again to form the third auxiliary p-type base layer 24.

Further, boron is ion-implanted and diffused to about 4 μm in a surface portion within a region between trenches where the first auxiliary p-type base layer 22 to third auxiliary p-type base layer 24 are not formed, thereby forming a p-type base layer 13. Arsenic is selectively ion-implanted and diffused to about 0.5 μm except the central portion, thereby forming n+-type emitter layers 14 with an area of about 2 μm².

Interlayer dielectric films 19 are formed by CVD, and openings are formed for contact with the p-type base layer 13 and n+-type emitter layer 14. An opening is also formed for contact with the third auxiliary p-type base layer 24, and an emitter electrode 17 is formed.

A V—Ni—Au film or the like is deposited on the lower surface of the semiconductor substrate 11 to form a collector electrode 18.

According to the second embodiment, the p-channel MISFET comprised of the first auxiliary p-type base layer 22, second auxiliary n-type base layer 23, and third auxiliary p-type base layer 24 is formed within the same chip 3 as that of the IGBT so as to share the gate electrode. The second embodiment obtains the same operations and effects as those of the first embodiment.

THIRD EMBODIMENT

Figure 9:
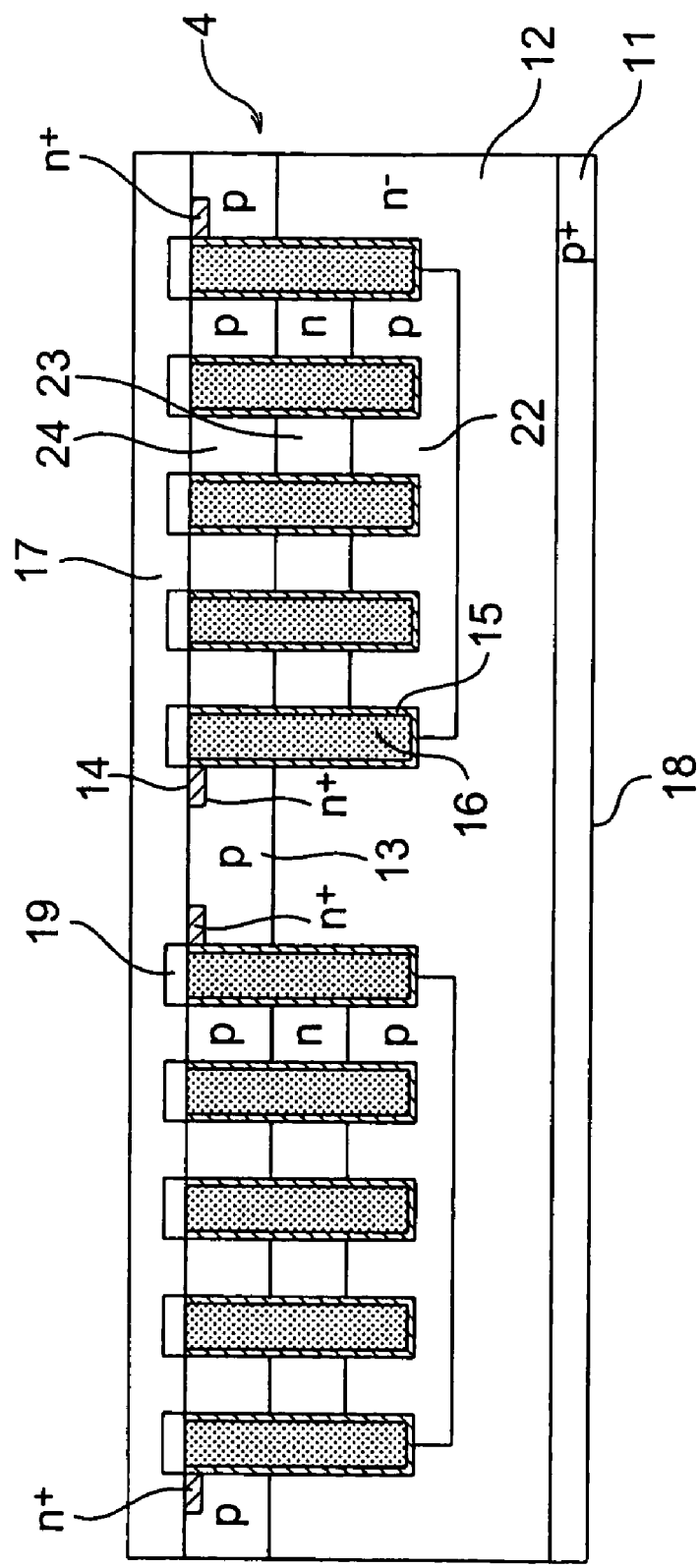
FIG. 9 is a longitudinal sectional view showing the sectional structure of a trench gate IGBT included in a semiconductor device according to the third embodiment of the present invention.
Figure 10:
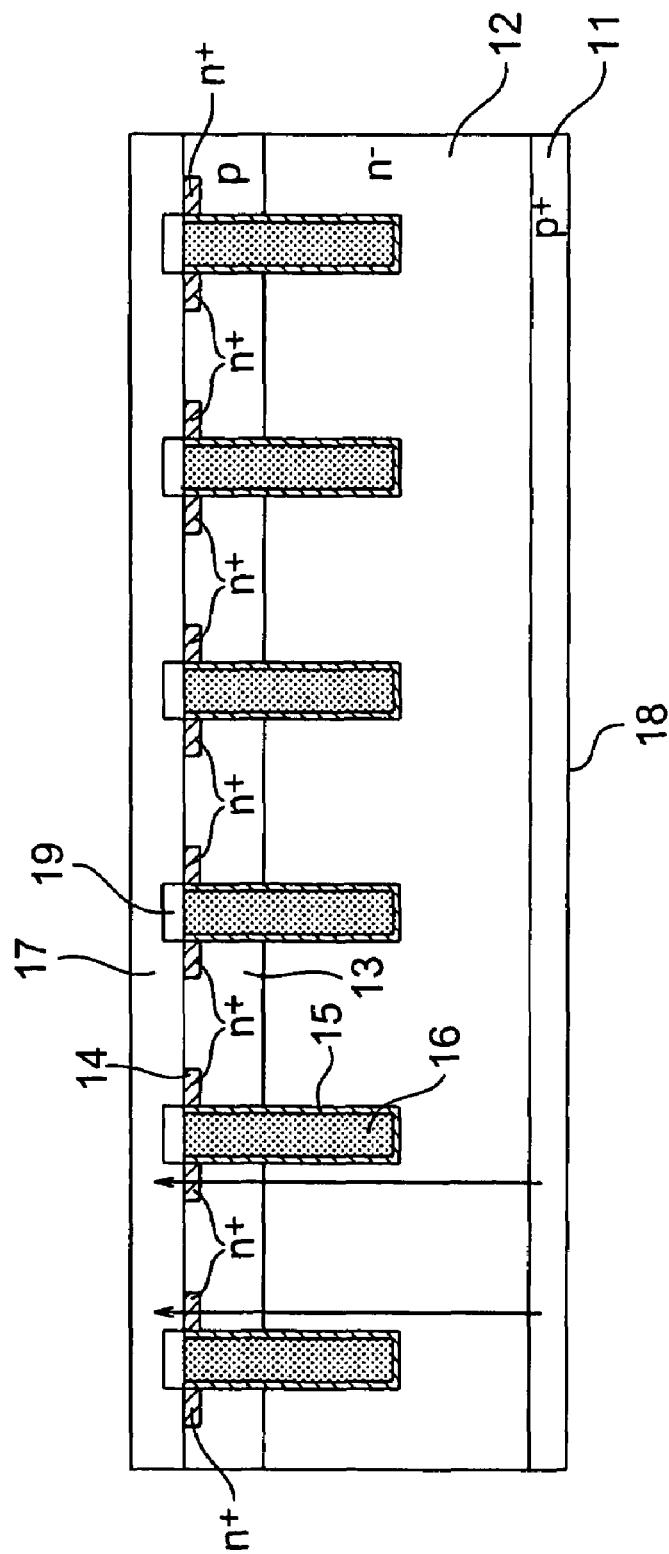
FIG. 10 is a longitudinal sectional view showing the sectional structure of a conventional trench gate IGBT

A trench IGBT included in a semiconductor device according to the third embodiment of the present invention will be described with reference to FIG. 9 showing the sectional structure of a chip 4.

In the structure of the semiconductor device according to the third embodiment, gate electrodes are formed between structures each of a first auxiliary p-type base layer 22, second auxiliary n-type base layer 23, and third auxiliary p-type base layer 24 formed between adjacent gate electrodes in the second embodiment. A plurality of p-channel MISFETs are formed by the base layers 22 to 24.

A plurality of p-channel MISFETs can efficiently discharge carriers in turn-off, and increase the turn-off speed.

The first to third embodiments are merely examples, and do not limit the present invention. For example, all conductivity types in the first to third embodiments may be inverted.

In the first embodiment, the auxiliary p-type base layer 20 is formed every other regions between adjacent trenches. The auxiliary p-type base layer 20 need not always be formed every other regions, and may be formed in a smaller number of arbitrary regions. Similarly, in the second and third embodiments, the first auxiliary p-type base layer 22, second auxiliary n-type base layer 23, and third auxiliary p-type base layer 24 are formed every other regions between adjacent trenches. These base layers need not always be formed every other regions, and may be formed in a smaller number of arbitrary regions.

In the third embodiment, three gate electrodes are arranged for a set of base layers 22 to 24 which are formed between two gate electrodes. The number of gate electrodes can be arbitrarily set.

What is claimed is:

1. A semiconductor device including a trench gate IGBT, comprising:
   a first semiconductor layer of a first conductivity type;
   a second semiconductor layer of a second conductivity type which is formed on one surface of said first semiconductor layer;
   a base layer of the first conductivity type which is formed in a surface portion of the second semiconductor layer;
   emitter layers of the second conductivity type which are selectively formed in a surface portion of said base layer;
   a plurality of trenches which extend through said emitter layers and said base layer and are formed to a predetermined depth in the second semiconductor layer;
   gate electrodes which are formed on gate insulating films in the trenches;
   an emitter electrode which is formed on said emitter layers and said base layer;
   a collector electrode which is formed on the other surface of said first semiconductor layer;
   an auxiliary base layer of the first conductivity type which is formed in an arbitrary region between two adjacent trenches and is insulated from said emitter electrode; and
   a carrier discharge electrode which contacts a surface of said auxiliary base layer of the first conductivity type;
   further comprising a MISFET including a channel region of the first conductivity type;
   wherein a source of said MISFET is connected to said carrier discharge electrode of the trench gate IGBT, and a drain of said MISFET is connected to said emitter electrode of the trench gate IGBT;
   wherein said MISFET is mounted in the same package as a package of the trench gate IGBT;
   wherein said MISFET is formed on a third semiconductor layer which is formed on said second semiconductor layer and insulated from said second semiconductor layer.

2. A semiconductor device including a trench gate IGBT, comprising:
   a first semiconductor layer of a first conductivity type;
   a second semiconductor layer of a second conductivity type which is formed on one surface of said first semiconductor layer;
   a base layer of the first conductivity type which is formed in a surface portion of the second semiconductor layer;
   emitter layers of the second conductivity type which are selectively formed in a surface portion of said base layer;
   a plurality of trenches which extend through said emitter layers and said base layer and are formed to a predetermined depth in the second semiconductor layer;
   gate electrodes which are formed on gate insulating films in the trenches;
   an emitter electrode which is formed on said emitter layers and said base layer;
   a collector electrode which is formed on the other surface of said first semiconductor layer;
   an auxiliary base layer of the first conductivity type which is formed in an arbitrary region between two adjacent trenches and is insulated from said emitter electrode; and
   a carrier discharge electrode which contacts a surface of said auxiliary base layer of the first conductivity type;
   further comprising a MISFET including a channel region of the first conductivity type;
   wherein a source of said MISFET is connected to said carrier discharge electrode of the trench gate IGBT, and a drain of said MISFET is connected to said emitter electrode of the trench gate IGBT;
   wherein said MISFET is mounted in the same package as a package of the trench gate IGBT;
   wherein said MISFET is mounted on a frame different from a frame of the trench gate IGBT.

3. A device according to claim 2, wherein said MISFET includes a vertical MISFET in which a source and a drain are vertically positioned.

4. A semiconductor device including a trench gate IGBT, comprising:
    a first semiconductor layer of a first conductivity type;
    a second semiconductor layer of a second conductivity type which is formed on one surface of said first semiconductor layer;
    a base layer of the first conductivity type which is formed in a surface portion of the second semiconductor layer;
    emitter layers of the second conductivity type which are selectively formed in a surface portion of said base layer;
    a plurality of trenches which extend through said emitter layers and said base layer and are formed to a predetermined depth in the second semiconductor layer;
    gate electrodes which are formed on gate insulating films in the trenches;
    an emitter electrode which is formed on said emitter layers and said base layer;
    a collector electrode which is formed on the other surface of said first semiconductor layer;
    an auxiliary base layer of the first conductivity type which is formed in an arbitrary region between two adjacent trenches and is insulated from said emitter electrode; and
    a carrier discharge electrode which contacts a surface of said auxiliary base layer of the first conductivity type;
    further comprising a MISFET including a channel region of the first conductivity type;
    wherein a source of said MISFET is connected to said carrier discharge electrode of the trench gate IGBT, and a drain of said MISFET is connected to said emitter electrode of the trench gate IGBT;
    wherein said MISFET and the trench gate IGBT are mounted in different packages.

5. A device according to claim 4, wherein the trench gate IGBT comprises a first comb electrode connected to said emitter electrode, and a second comb electrode which faces the first comb electrode and is connected to said carrier discharge electrode.

6. A device according to claim 4, wherein the trench gate IGBT comprises a first interconnection layer connected to said carrier discharge electrode, and a second interconnection layer connected to said emitter electrode, and the first interconnection layer and the second interconnection layer are vertically so arranged as to sandwich an insulating film.

7. A semiconductor device including a trench gate IGBT, comprising:
    a first semiconductor layer of a first conductivity type;
    a second semiconductor layer of a second conductivity type which is formed on one surface of said first semiconductor layer;
    a base layer of the first conductivity type which is formed in a surface portion of the second semiconductor layer;
    emitter layers of the second conductivity type which are selectively formed in a surface portion of said base layer;
    a plurality of trenches which extend through said emitter layers and said base layer and are formed to a predetermined depth in the second semiconductor layer;
    gate electrodes which are formed on gate insulating films in the trenches;
    an emitter electrode which is formed on said emitter layers and said base layer;
    a collector electrode which is formed on the other surface of said first semiconductor layer;
    a first auxiliary base layer of the first conductivity type which is formed in an arbitrary region between two adjacent trenches and is insulated from said emitter electrode;
    a second auxiliary base layer of the second conductivity type which is formed on the first auxiliary base layer of the first conductivity type in the region;
    a third auxiliary base layer of the first conductivity type which is formed on the second auxiliary base layer of the second conductivity type in the region and contacts said emitter electrode; and
    a carrier discharge electrode which contacts a surface of said third auxiliary base layer of the first conductivity type.

8. A device according to claim 7, further comprising:
    at least one auxiliary trench which is so formed as to extend through said third auxiliary base layer of the first conductivity type and said second auxiliary base layer of the second conductivity type and reach a predetermined depth in said third auxiliary base layer of the first conductivity type in the region where said first auxiliary base layer of the first conductivity type, said second auxiliary base layer of the second conductivity type, and said third auxiliary base layer of the first conductivity type are formed; and
    an auxiliary gate electrode which is formed on a gate insulating film in the auxiliary trench.

9. A semiconductor device including a trench gate IGBT, comprising:
    a trench gate IGBT having
    a first semiconductor layer of a first conductivity type,
    a second semiconductor layer of a second conductivity type which is formed on one surface of the first semiconductor layer,
    a base layer of the first conductivity type which is formed in a surface portion of the second semiconductor layer,
    emitter layers of the second conductivity type which are selectively formed in a surface portion of the base layer,
    a plurality of trenches which extend through the emitter layers and the base layer and are formed to a predetermined depth in the second semiconductor layer,
    gate electrodes which are formed on gate insulating films in the trenches,
    an emitter electrode which is formed on the emitter layers and the base layer,
    a collector electrode which is formed on the other surface of the first semiconductor layer,
    an auxiliary base layer of the first conductivity type which is formed in an arbitrary region between two adjacent trenches, and
    a carrier discharge electrode which contacts a surface of the auxiliary base layer of the first conductivity type; and
    a MISFET which includes a channel region of the first conductivity type, and includes a source connected to the carrier discharge electrode of the trench gate IGBT, a drain connected to the emitter electrode of the trench gate IGBT, and a gate electrode electrically connected to the gate electrode of the trench gate IGBT;
    wherein said MISFET is mounted in the same package as a package of the trench gate IGBT;
    wherein said MISFET is formed on a third semiconductor layer which is formed on said second semiconductor layer and insulated from said second semiconductor layer.

10. A semiconductor device including a trench gate IGBT, comprising:

a trench gate IGBT having
a first semiconductor layer of a first conductivity type,
a second semiconductor layer of a second conductivity type which is formed on one surface of the first semiconductor layer,
a base layer of the first conductivity type which is formed in a surface portion of the second semiconductor layer,
emitter layers of the second conductivity type which are selectively formed in a surface portion of the base layer,
a plurality of trenches which extend through the emitter layers and the base layer and are formed to a predetermined depth in the second semiconductor layer,
gate electrodes which are formed on gate insulating films in the trenches,
an emitter electrode which is formed on the emitter layers and the base layer,
a collector electrode which is formed on the other surface of the first semiconductor layer,
an auxiliary base layer of the first conductivity type which is formed in an arbitrary region between two adjacent trenches, and
a carrier discharge electrode which contacts a surface of the auxiliary base layer of the first conductivity type; and
a MISFET which includes a channel region of the first conductivity type, and includes a source connected to the carrier discharge electrode of the trench gate IGBT, a drain connected to the emitter electrode of the trench gate IGBT, and a gate electrode electrically connected to the gate electrode of the trench gate IGBT;
wherein said MISFET is mounted in the same package as a package of the trench gate IGBT;
wherein said MISFET is mounted on a frame different from a frame of the trench gate IGBT.

11. A device according to claim 10, wherein said MISFET includes a vertical MISFET in which a source and a drain are vertically positioned.

12. A semiconductor device including a trench gate IGBT, comprising:

a trench gate IGBT having
a first semiconductor layer of a first conductivity type,
a second semiconductor layer of a second conductivity type which is formed on one surface of the first semiconductor layer,
a base layer of the first conductivity type which is formed in a surface portion of the second semiconductor layer,
emitter layers of the second conductivity type which are selectively formed in a surface portion of the base layer,
a plurality of trenches which extend through the emitter layers and the base layer and are formed to a predetermined depth in the second semiconductor layer,
gate electrodes which are formed on gate insulating films in the trenches,
an emitter electrode which is formed on the emitter layers and the base layer,
a collector electrode which is formed on the other surface of the first semiconductor layer,
an auxiliary base layer of the first conductivity type which is formed in an arbitrary region between two adjacent trenches, and
a carrier discharge electrode which contacts a surface of the auxiliary base layer of the first conductivity type; and
a MISFET which includes a channel region of the first conductivity type, and includes a source connected to the carrier discharge electrode of the trench gate IGBT, a drain connected to the emitter electrode of the trench gate IGBT, and a gate electrode electrically connected to the gate electrode of the trench gate IGBT;
wherein said MISFET and the trench gate IGBT are mounted in different packages.

13. A device according to claim 12, wherein the trench gate IGBT comprises a first comb electrode connected to said emitter electrode, and a second comb electrode which faces the first comb electrode and is connected to said carrier discharge electrode.

* * * * *